US008212549B2

(12) United States Patent  (10) Patent No.: US 8,212,549 B2
McNulty et al.  (45) Date of Patent: Jul. 3, 2012

(54) AMMETER WITH IMPROVED CURRENT SENSING

(75) Inventors: William J. McNulty, Washington, DC (US); James S. Buchanan, Northbrook, IL (US); Connor M. McNulty, Washington, DC (US)

(73) Assignee: HD Electric Company, Waukegan, IL (US)

( * ) Notice: Subject to any disclaimer, the term of this patent is extended or adjusted under 35 U.S.C. 154(b) by 46 days.

(21) Appl. No.: 12/372,768

(22) Filed: Feb. 18, 2009

(65) Prior Publication Data

US 2010/0207603 A1   Aug. 19, 2010

(51) Int. Cl.
*G01R 7/00* (2006.01)
(52) U.S. Cl. ............... 324/141; 324/117 R; 324/126; 324/140 R; 324/127
(58) Field of Classification Search ...... 324/117 R–142, 324/127, 117 H, 141
See application file for complete search history.

(56) References Cited

U.S. PATENT DOCUMENTS

| | | | | |
|---|---|---|---|---|
| 3,396,338 | A | * | 8/1968 | Buchanan et al. ......... 324/117 R |
| 3,626,291 | A | * | 12/1971 | Yauch et al. ................. 324/127 |
| 4,408,175 | A | | 10/1983 | Nelson et al. |
| 4,438,396 | A | * | 3/1984 | Harnden et al. ............. 324/127 |
| 4,839,600 | A | | 6/1989 | Kuurstra |
| 4,947,107 | A | * | 8/1990 | Doerfler et al. ............... 324/96 |
| 5,057,769 | A | * | 10/1991 | Edwards ...................... 324/127 |
| 5,140,257 | A | | 8/1992 | Davis |
| 5,151,649 | A | | 9/1992 | Heroux |
| 6,144,196 | A | * | 11/2000 | Tamaki .................... 324/117 R |
| 6,586,923 | B2 | * | 7/2003 | Seike ........................ 324/117 H |
| 6,717,397 | B2 | * | 4/2004 | Sorenson, Jr. ............... 324/126 |
| 6,734,661 | B2 | | 5/2004 | Colby et al. |
| 6,825,650 | B1 | | 11/2004 | McCormack et al. |
| 7,327,133 | B2 | * | 2/2008 | Baker et al. .............. 324/117 H |
| 2005/0156587 | A1 | | 7/2005 | Yakymyshyn et al. |

FOREIGN PATENT DOCUMENTS

FR    2690752 A1   11/1993
JP    11002647 A2    1/1999

OTHER PUBLICATIONS

International Search Report and Written Opinion dated Apr. 15, 2010 re PCT/US2010/024090.
International Preliminary Report on Patentability and Written Opinion in International Patent Application PCT/US2010/024090, mailed Sep. 1, 2011.

* cited by examiner

*Primary Examiner* — Vinh Nguyen
*Assistant Examiner* — Emily Chan
(74) *Attorney, Agent, or Firm* — McDonnell Boehnen Hulbert & Berghoff LLP

(57) ABSTRACT

An ammeter is provided with a plurality of individual wound coils interconnected in a generally U-shaped array to measure the magnitude of current in a conductor extending through a sensing region inside the U-shape. Additional pairs of position-sensing coils determine the position of the conductor relative to the sensing region and provide outputs to circuitry which permits the magnitude measurement to be displayed only if the conductor extends through the sensing region.

19 Claims, 3 Drawing Sheets

AMMETER WITH IMPROVED CURRENT SENSING

TECHNICAL FIELD

This application relates to ammeters, and has particular application to ammeters for use with high-voltage circuits, such as those found in electric power transmission and distribution systems, although the principles of the invention have applicability to low-voltage circuits, as well.

BACKGROUND

The generally accepted method for accurately measuring power frequency AC currents uses a current transformer. A current transformer is generally a toroid-shaped magnetic core with windings around the core, typically about 100 turns or more. The magnetic core is constructed of some ferrous material or alloy. In use, the conductor, the current in which is to be measured is passed through the hole in the center of the toroidal magnetic core. The current flowing in the conductor to be measured generates a magnetic field, which is captured within the magnetic toroid of the current transformer which surrounds it. This magnetic field induces a current in the windings around the toroidal core in the ratio of the number of windings to one, the one being the conductor passing once through the core of the toroid. With 100 turns around the core, this current transformer has a ratio of 100:1. The advantages of this type of current transformer are several: high accuracy, rejection of or insensitivity to current carrying conductors anywhere outside the core and very low sensitivity as to how the conductor to be measured is placed or positioned through the hole in the center of the magnetic core.

The primary disadvantage of using a toroidal magnetic iron core current transformer in pre-existing circuits is that it cannot simply be placed around the conductor to be measured. For this reason, current transformers of this type are generally restricted to laboratory use. Iron core current transformers can, however, be constructed with hinged openings in the iron core so as to allow the core to be temporarily opened while it is placed over a conductor to be measured and these types of devices do have good accuracy and good rejection of current-carrying conductors outside the center of the core. As a practical matter however, the mechanical complexity of opening and closing the hinged core and the weight of the iron core are substantial disadvantages for a tool to be used in the field.

There are alternative current transformer designs which do not use any heavy magnetic core and the Rogowski coil is the most popular. However, for best accuracy, the Rogowski coil must also be constructed so as to completely encircle the conductor to be measured. Rogowski coils provided with a permanent opening so as to allow the coil to be placed conveniently over or around the conductor to be measured suffer from reduced accuracy and consistency, in that the measured current can vary with the position of the conductor to be measured relative to the opening in the Rogowski coil. In addition, other current carrying conductors placed nearby, but still outside of the opening of the Rogowski coil, will influence the measurements made of conductors inside the opening.

Two noteworthy improvements have been made to the open Rogowski coil. One is described in U.S. Pat. No. 5,057,769 and discloses compensating coils located at the opening in the Rogowski coil. This approach works well to allow accurate measurements to be made for conductors inside the opening, but it does not reduce the influence of conductors just outside the opening.

A second improvement is described in U.S. Pat. No. 6,717,397, which discloses a modification of the Rogowski coil to replace the continuous coil with many small discrete coils with an equal number of openings between them. While this construction allows great flexibility in design and low-cost construction, it has considerable disadvantages in terms of how the conductor to be measured must be centered with respect to the cluster of individual coils, and it still allows substantial influence of conductors outside of the cluster of individual coils.

While these two improvements do allow for convenience of use and for compact and lightweight construction, neither of them equals the performance of a closed Rogowski coil or of an iron core current transformer, with their accurate measurement of conductors inside the core/coil and high degree of rejection of conductors outside the core/coil.

A number of companies presently manufacture high-voltage "hot-stick" ammeters designed to measure power frequency line current by direct application to power lines, which may be energized at voltages up to 69 kV or more. For example, referring to FIG. 1, such an ammeter 10 is shown, provided with a sensing head 11 adapted to fit around an electric power line 12, which may, e.g., may be a power transmission or distribution line, carried by utility poles 13 or the like. Such ammeters are often used with an extension hot-stick 15, which both extends the reach of the user and insulates the user from the high voltage which may be present on the power line.

Hot-stick ammeters are generally used to make instantaneous or very short-term measurements of current flowing in a power line. In use they are placed around a power line for only a few seconds, during which the current flowing in the power is measured by means of some type of current sensor or current transformer, after which the ammeter is withdrawn from the power line and the measured current can be viewed in a display, which may be digital.

For ease of use, the sensing head 11 of the high-voltage hot-stick ammeter 10 is designed as a simple open channel in a U or C shape, so that it can be easily placed over or around the power line 12. When the device is placed over the power line 12, as shown, the strength of the magnetic field from the power line, which is directly proportional to the current flowing in the line, is detected and sensed by the current sensing portion of the ammeter. Suitable sensing coils and electronic circuits measure the strength of the magnetic field and convert it to digital form to be displayed as digits on the front panel of the ammeter and/or to be recorded in digital form within the ammeter for later display or transfer to other devices. The displayed or recorded digits indicate amperes of current flowing in the power line.

Such ammeters suffer from the disadvantages discussed above, with respect to Rogowski coils having a permanent opening. Furthermore, in hot-stick applications, wherein the user may be positioned at some distance from the conductor or power line, the current of which is to be measured, it is frequently difficult to tell whether or not the conductor is positioned relative to the sensing head so as to ensure accurate current measurement. Thus, the user may not be sure whether or not the displayed current reading is an accurate reading.

SUMMARY OF THE INVENTION

The present invention avoids the disadvantages of prior ammeters, while affording additional structural and operating advantages.

An aspect of the invention is the provision of an ammeter which defines a sensing region, provides accurate measurement of current flowing in a conductor extending through the sensing region, and senses whether or not the conductor extends through the sensing region.

A further aspect of the invention is the provision of an ammeter of the type set forth, which will provide a display of the current measurement only when the conductor is extending through the sensing region.

A still further aspect of the invention is the provision of an ammeter of the type set forth, which utilizes pluralities of position-sensing coils to detect the position of the conductor relative to the sensing region.

In an embodiment of the invention, an ammeter is provided having a current-detecting circuit including a current-sensing structure arranged to define a sensing region and adapted to sense the magnitude of electric current flowing in a conductor extending through the sensing region. According to this embodiment, a position-detecting circuit is provided which includes position-sensing coil structure arranged to detect the position of the conductor relative to the sensing region.

In accordance with a further embodiment of the invention, there is provided an ammeter with a current-detecting circuit including a plurality of current-sensing coils interconnected in a generally U-shaped array which has two legs with first ends interconnected by a bight and second ends spaced apart by a gap, the array defining a sensing region extending from one leg to the other and from the bight to the gap. In accordance with this embodiment, the array is adapted to sense the magnitude of electric current flowing in a conductor extending through the sensing region. According to this embodiment, there is further provided a position-detecting circuit including a first pair of coils respectively disposed along the legs of the array intermediate the ends thereof for detecting displacement of the conductor from the sensing region in first directions, and a second pair of coils respectively disposed at the second ends of the legs for detecting displacement of the conductor from the sensing region in a second direction. Further in accordance with this embodiment, there is provided display circuitry for displaying the magnitude of the current when the conductor is disposed in the sensing region.

In accordance with a further embodiment of the invention, a method is provided for measuring current flow in a conductor. The method includes the steps of sensing the magnitude of the current flowing in the conductor, defining a sensing region, sensing whether or not the conductor extends through the sensing region, displaying the sensed current magnitude if the conductor extends through the sensing region, and preventing display of the sensed current magnitude if the conductor does not extend through the sensing region.

DETAILED DESCRIPTION

Figure 1:
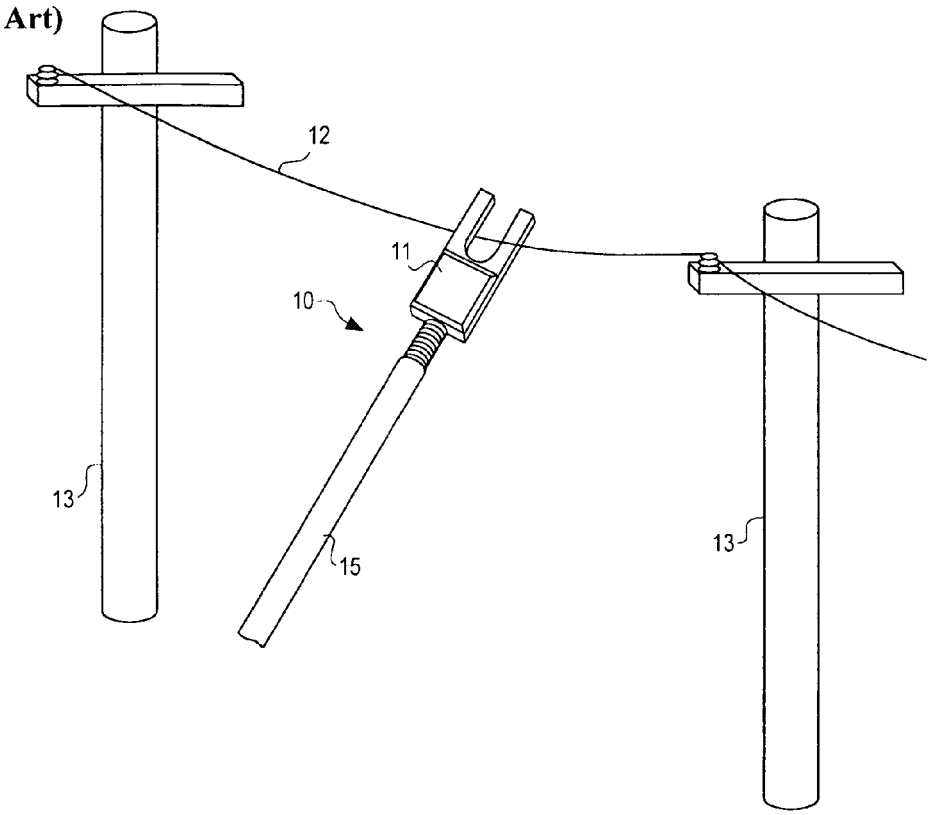
FIG. 1 is a perspective view of a prior-art ammeter in use with an AC power line.
Figure 2:
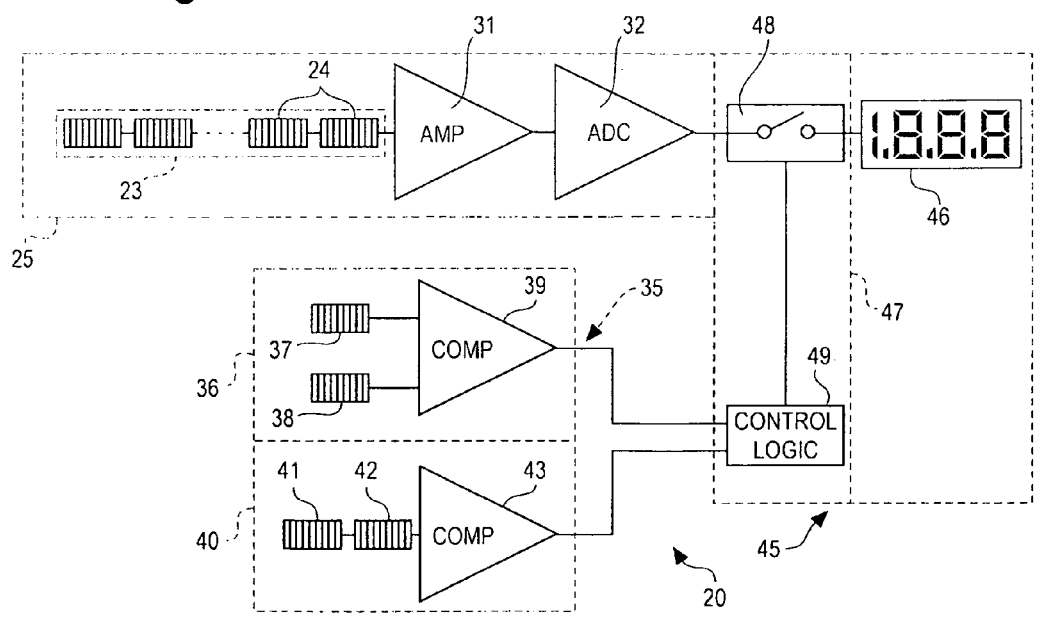
FIG. 2 is a functional block diagram of the circuitry of an ammeter in accordance with the present invention.
Figure 3:
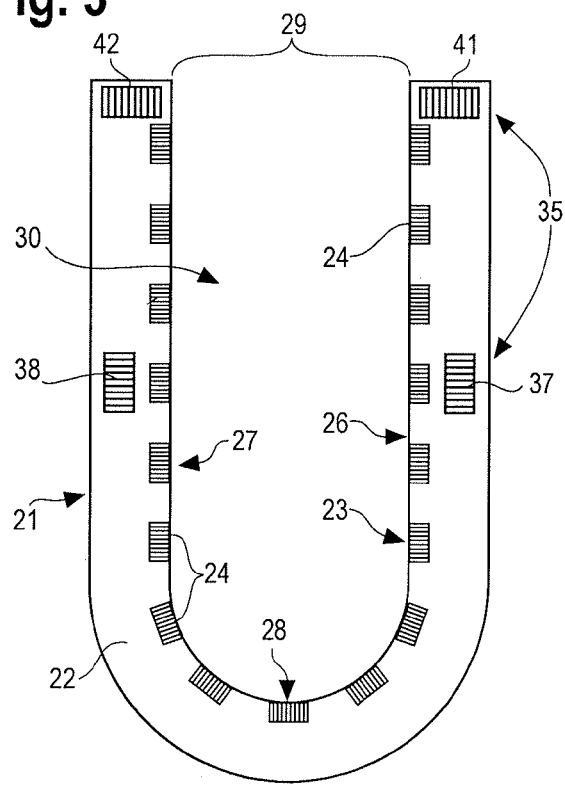
FIG. 3 is a top plan view of the circuitry of the sensing head of the ammeter of FIG. 2.

Referring to FIG. 2, there is illustrated an ammeter, generally designated by the numeral 20, constructed in accordance with and embodying the features of the present invention. Referring also to FIG. 3, the ammeter 20 includes a sensing head 21, which includes a generally U-shaped substrate 22, which may be in the form of a printed circuit board, and will typically be disposed in a suitable U-shaped housing (not shown). The sensing head 21 carries a current-sensing coil structure 23 which includes a plurality of coils 24 arranged in a linear array extending along the U-shaped substrate 22 to form a generally U-shaped array including legs 26 and 27 interconnected at one end thereof by a bight 28. The opposite ends of the legs are spaced apart by a gap 29. The coils 24 of the current-sensing coil structure 23 are interconnected, as by printed circuitry, and form a part of a current-detecting circuit 25 (FIG. 2). The U-shaped array defines a sensing region 30 extending between the legs 26 and 27 and between the bight 28 and the gap 29. The current-detecting circuit 25 also includes an amplifier 31, the input of which is connected to the output of the coil structure 23, and the output of which is connected to the input of an analog-to-digital converter ("ADC") 32.

The sensing head 21 also includes a position-detecting circuit 35, which includes a first portion 36, which includes a first pair of position-sensing coils 37 and 38, which are, respectively, connected to the inputs of a comparator 39. The position-detecting circuit 35 also has a second portion 40 including a second pair of position-sensing coils 41 and 42 connected to the input of a comparator 43. While the coils 41 and 42 are shown connected in series, this need not be the case. The coils 37, 38, 41 and 42, in combination, provide a position-sensing coil structure. The coils 37 and 38 have their axes substantially parallel to the legs 26 and 27, while the coils 41 and 42 have a substantially common axis substantially perpendicular to the axes of the coils 37 and 38.

The ammeter 20 also includes display circuitry 45 which includes a display 46, which may be a digital display. The display circuitry 45 also includes display control circuitry 47, which includes an electronic switch 48 connected in series between the output of the ADC 32 and the input of the display 46, the switch having a control terminal connected to the output of control logic 49 which is, in turn, connected to the outputs of the comparators 39 and 43.

It can be seen that the ammeter 20 replaces the traditional continuous-wound Rogowski coil with several small individual wound coils arranged in a generally U-shaped array. These coils 24 cooperate to measure the current in a conductor 12 extending through the sensing region 30, in the same manner as would a continuous U-shaped coil. The individual sensing coils 24 may be soldered in place on a printed circuit board, which also provides the means to interconnect the sensing coils 24 electrically. Connected together, these coils 24 approximate an open Rogowski coil with the opening in the coil shown at 29 at the top in the drawings. The individual sensing coils 24 are used to sense the current flowing in the conductor 12 to be measured by taking advantage of the well-known right-hand rule, which relates the direction of current flow in a conductor to the direction of the resulting magnetic field lines surrounding that conductor, all in a well-known manner.

Figure 4:
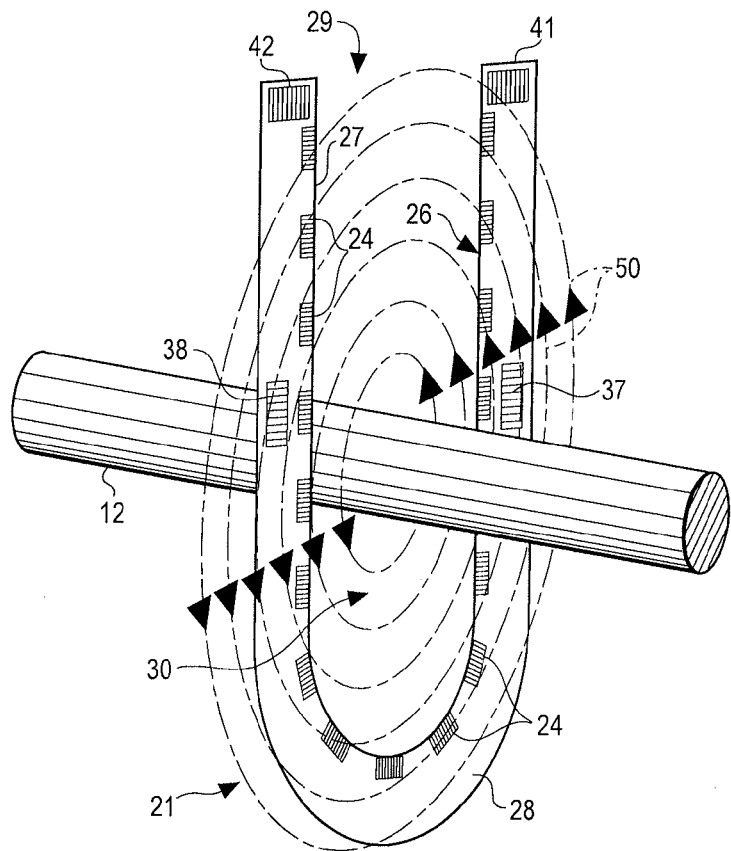
FIG. 4 is a perspective view of the sensing head of FIG. 3 disposed around a current-carrying conductor, and illustrating magnetic field lines generated by the current in the conductor.

Referring to FIG. 4, in operation, the sensing head 21 is placed around the conductor 12 to be measured by passing the conductor 12 through the gap 29 so that the conductor extends through the approximate center of the sensing region 30. The magnetic field lines 50 resulting from the current flowing in the conductor (in this case assumed to flow from left to right, as viewed in the drawings) passes through all of the current-sensing coils 24 and, according to the right-hand rule induces a current in these coils. This induced current in the sensing coils 24 is proportional to the current in the conductor 12 to be measured. As can be seen in FIG. 4, all of the coils 24 are arranged with their rotational axes aligned essentially longitudinally of the U-shaped array. Thus, the magnetic field lines 50 pass through all of the coils 24 in essentially the same direction, so that all of the coils 24 produce a current and voltage of the same polarity. The signal from the interconnected coils 24 is amplified in the amplifier 31 and the resulting signal is converted to a digital format in the ADC 32, the resulting digital signal being connected to the switch 48, which is normally in an open condition.

While this arrangement is suitable for providing a measure of the current in the conductor to be measured, it is, like other existing schemes, susceptible to errors when the conductor is placed at or beyond the gap 29 in the U-shaped array, or alongside, but not between, the legs 26 and 27 of the array. Accordingly, the position-detecting circuit 35 is provided to sense the position of the conductor 12 relative to the sensing region 30.

The first pair of coils 37 and 38 are, respectively, disposed along the legs 26 and 27 of the U-shaped array, intermediate the ends thereof and, specifically, substantially midway between the bight 28 and the gap 29. Thus, as can be seen in FIG. 4, when the magnetic field lines 50 from the conductor 12 to be measured are oriented counterclockwise, as illustrated, it can be seen that the magnetic field is crossing the coil 37 from bottom to top and is crossing the coil 38 from top to bottom. This passing of the magnetic field through the coils 37 and 38 in opposite directions, results in opposite-polarity voltages being induced, respectively, in these coils.

Figure 5:
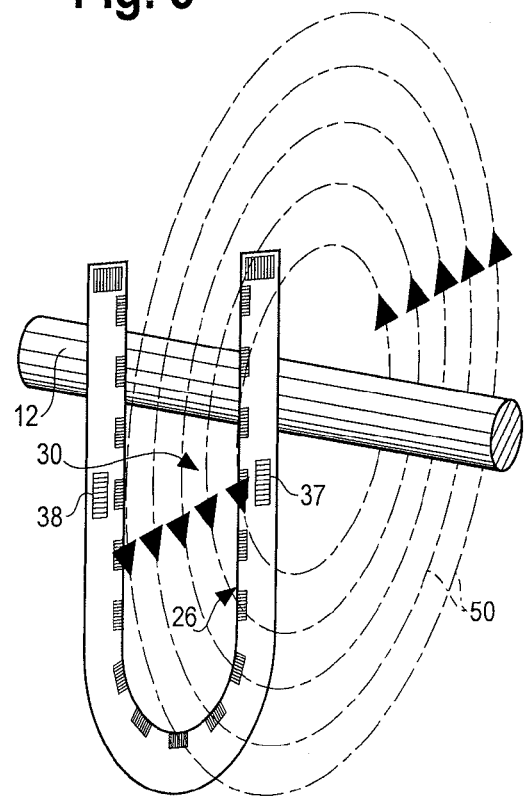
FIG. 5 is a view similar to FIG. 4, with the conductor displaced in a first direction outside the sensing head.
Figure 6:
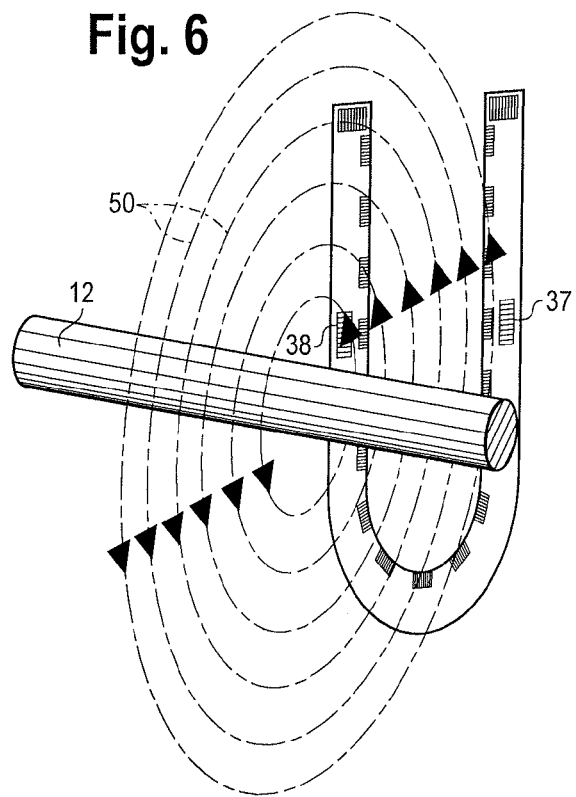
FIG. 6 is a view similar to FIG. 4 with the conductor displaced outside the sensing head in a second direction.

This will not be true, however, if the conductor 12 is disposed alongside one of the legs 26 or 27, but outside the sensing region 30. Thus, referring to FIG. 5, if the conductor 12 is disposed on the right-hand side of the leg 26, the magnetic field lines 50 will pass through the coils 37 and 38 in the same direction, i.e., from top to bottom. Contrariwise, referring to FIG. 6, if the conductor 12 is disposed to the left of the leg 27, the magnetic field lines 50 will pass through both of the coils 37 and 38 from bottom to top. Accordingly, since the current induced in the coils 37 and 38 is of the same polarity, it signifies that the conductor 12 is located outside the sensing region 30 in a direction generally orthogonal to the legs 26 and 27.

Thus, when the conductor 12 is extending through the sensing region 30, the opposite-polarity outputs of the coils 37 and 38 will cause the comparator 39 to output a zero signal. If, on the other hand, the conductor 12 is in either of the positions illustrated in FIGS. 5 and 6, i.e., displaced from the sensing region 30 in directions generally orthogonal to the legs 26 and 27, the like-polarity outputs from the coils 37 and 38 will cause the comparator 39 to generate a positive or binary "1" output signal.

Figure 7:
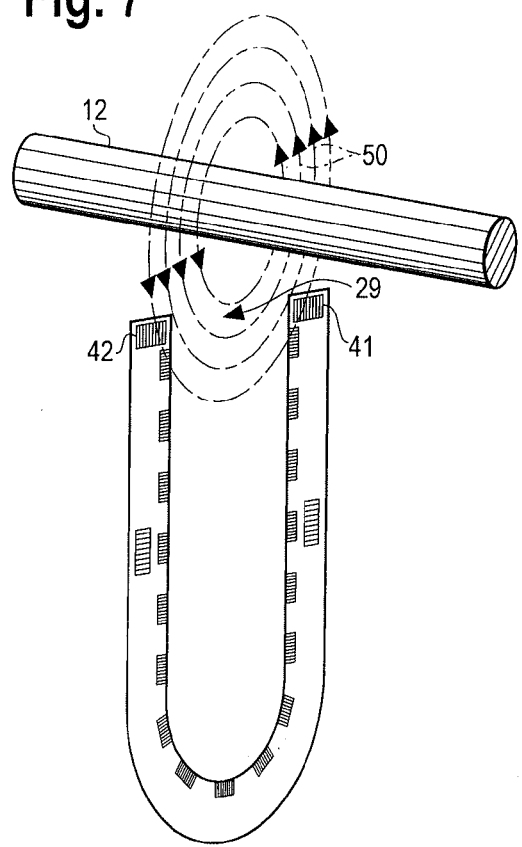
FIG. 7 is a view similar to FIG. 4 showing the conductor displaced beyond the open end of the sensing head.

Referring again to FIG. 4, when the conductor 12 extends through the sensing region 30, the magnetic field lines 50 will pass through the sensing coils 41 and 42 in substantially the same direction, i.e., generally from right to left, as viewed in the figures. If, however, the conductor 12 is disposed beyond the gap 29, as shown in FIG. 7, the magnetic field lines 50 will pass through the coils 41 and 42 generally from left to right. Thus, for a given circuit configuration, when the conductor 12 extends through the sensing region 30, a positive polarity voltage will be induced in both of the coils 41 and 42, whereas when it is in the position of FIG. 7, with the conductor 12 displaced from the sensing region 30 in a direction generally parallel to the legs 26 and 27, a negative polarity voltage will be induced in both coils. Thus, the polarity of the voltage induced in the coils 41 and 42 indicates whether the conductor is inside or outside of the gap 29 in the U-shaped array of current-sensing coils 24. The coils 41 and 42 are connected together so that the combined polarity of the signals from these coils is input to the comparator 43 and compared with an internal reference voltage. If the polarity of the signal from the coils 37 and 38 is positive, the comparator will generate a positive or binary "1" signal, whereas if the polarity from the coils is negative, the comparator will generate a zero signal.

Figure 8:
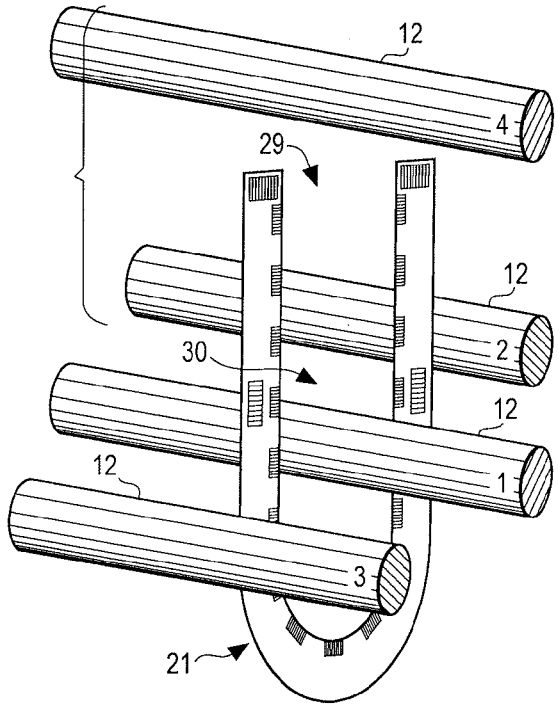
FIG. 8 is a composite view illustrating the conductor positions of FIGS. 4, 5, 6 and 7, respectively designated 1, 2, 3 and 4.

From the foregoing, and referring to FIG. 8, it can be seen that the voltages induced in the coils 37 and 38 and 41 and 42 indicate something about the position of the conductor 12. Taken together, they provide a substantially complete picture of the position of the conductor. FIG. 8 illustrates a composite of the conductor positions illustrated in FIGS. 4-7, respectively designated 1-4. Table 1 illustrates the relationship among the conductor positions and the voltages in the two pairs of position-sensing coils.

TABLE 1

| Conductor Position | Voltages in Coils 37 and 38 | Voltages in Coils 41 and 42 |
| --- | --- | --- |
| 1 | Opposite polarity | Positive |
| 2 | Same polarity | Positive |
| 3 | Same polarity | Positive |
| 4 | Opposite polarity | Negative |

With the information in this table conductor position 1 can be uniquely determined from among the four possibilities shown in FIG. 8. Position 1 is the only position where the magnetic field from the conductor 12 induces both voltages of opposite polarity in the coils 37 and 38 and positive voltages in the coils 41 and 42. With this information identifying the position of the conductor 12 relative to the sensing region 30, the disadvantages of the open Rogowski coil can be substantially, if not completely, eliminated.

Referring to FIG. 2, the control logic 49 receives the signals from the two comparators 39 and 43 of the position-detecting circuit 35 and operates the switch 48 in accordance with Table 2.

TABLE 2

| Conductor Position | Voltages in Coils 37 and 38 | Voltages in Coils 41 and 42 | Switch Position |
| --- | --- | --- | --- |
| 1 | Opposite polarity | Positive | Closed |
| 2 | Same polarity | Positive | Open |
| 3 | Same polarity | Positive | Open |
| 4 | Opposite polarity | Negative | Open |

It can be seen that the logic is constructed such that only the combination of opposite polarities in the coils 37 and 38 and a positive polarity in the coils 41 and 42, corresponding to conductor position 1 in FIG. 8, will cause the switch 48 to close. When the switch is closed, the current magnitude signal from the ADC 32 is supplied to the digital display 46, which will display a number equal to the amperes of current flowing in the conductor 12 being measured. If the conductor 12 is in any of the positions 2-4 outside the sensing region 30, the switch will be in its normally open condition and the signal from the ADC 32 will not be supplied to the display 46, which will, therefore, show a zero current. Thus, the display will show the current measurement only when the conductor 12 is positioned so as to extend through the sensing region 30, in which position the current can be accurately measured. If the conductor 12 is in a position wherein the current cannot accurately be measured, no measurement is displayed. Thus, the user of the ammeter 20 will see no inaccurate or partial measurements while in the process of applying the ammeter to the power line 12, or in adjusting its position on the power line or removing it from the power line. A display of measured current will occur only when the measurement is known to be accurate by the proper positioning of the ammeter 20 relative to the power line conductor 12.

The display 46 will typically be disposed in a position where it can readily seen by the user. Thus, for example, if the ammeter 20 is mounted on an extension hot-stick, the display 46 could be mounted on the hot-stick adjacent to the user and be connected to the rest of the circuitry by a suitable cable or wirelessly. In applications where an extension hot-stick is not needed, the display 46 could be mounted on the sensing head 21. The remainder of the non-coil portion of the circuitry in FIG. 2 may be located in the sensing head 21, either on or adjacent to the substrate 22, or could alternatively be located remotely therefrom.

For certain other applications the display could be dispensed with altogether to be replaced by memory circuitry for later download of stored measurements to a suitable display device.

While the construction and operation of the ammeter 20 has been described primarily in connection with high-voltage applications, it will be appreciated that the principles of the present invention are also applicable to low-voltage circuits.

It will be appreciated that other modifications may be made to embodiments of the invention described above without departing from the scope of the invention.

The invention claimed is:

1. An ammeter comprising:
   a current-detecting circuit including a current-sensing coil structure arranged to define a sensing region and adapted to sense the magnitude of electric current flowing in a conductor extending through the sensing region;
   a position-detecting circuit including position-sensing coil structure arranged to detect the position of the conductor relative to the sensing region; and
   a housing comprising the current-detecting circuit and the position-detecting circuit.

2. The ammeter of claim 1, wherein the current detecting circuit is adapted to detect AC current of a voltage in the kilovolt range or higher.

3. The ammeter of claim 1, wherein each of the current-sensing coil structure and the position-sensing coil structure includes a plurality of coils.

4. The ammeter of claim 3, wherein the plurality of coils of the current-sensing coil structure are interconnected.

5. The ammeter of claim 3, wherein the position-sensing coil structure includes first and second pairs of coils for respectively detecting displacement of the conductor in two different, generally orthogonal directions.

6. The ammeter of claim 3, wherein the plurality of coils of the current-sensing coil structure is arranged in a generally U-shaped array.

7. The ammeter of claim 1, and further comprising a substrate carrying the current-sensing coil structure and the position-sensing coil structure.

8. An ammeter comprising:
   a current-detecting circuit including a plurality of current-sensing coils interconnected in a generally U-shaped array including two legs with first ends interconnected by a bight and second ends spaced apart by a gap,
   the array defining a sensing region extending from one leg to the other and from the bight to the gap,
   the array being adapted to sense the magnitude of electric current flowing in a conductor extending through the sensing region;
   a position-detecting circuit including a first pair of position-sensing coils respectively disposed along the legs of the array intermediate the ends thereof for detecting displacement of the conductor from the sensing region in first directions generally orthogonal to the legs,
   the position-detecting circuit including a second pair of position-sensing coils respectively disposed at the second ends of the legs for detecting displacement of the conductor from the sensing region in a second direction generally parallel to the legs; and
   display circuitry for displaying the sensed magnitude of the current when the conductor extends through the sensing region.

9. The ammeter of claim 8, wherein the coils of the first pair of position-sensing coils respectively have first axes which are substantially parallel to each other, the coils of the second pair of detecting coils having a substantially common second axis substantially perpendicular to the first axes.

10. The ammeter of claim 8, wherein the current-detecting circuit includes an amplifier connected to the output of the array of current-sensing coils, and a analog-to-digital converter connected to the output of the amplifier.

11. The ammeter of claim 8, and further comprising a substrate carrying the current-sensing coils and the first and second pairs of position-sensing coils.

12. The ammeter of claim 11, wherein the substrate includes a printed circuit board.

13. An ammeter comprising:
   a current-detecting circuit including a plurality of current-sensing coils interconnected in a generally U-shaped array including two legs with first ends interconnected by a bight and second ends spaced apart by a gap,
   the array defining a sensing region extending from one leg to the other and from the bight to the gap,
   the array being adapted to sense the magnitude of electric current flowing in a conductor extending through the sensing region;
   a position-detecting circuit including a first pair of position-sensing coils respectively disposed along the legs of the array intermediate the ends thereof for detecting displacement of the conductor from the sensing region in first directions generally orthogonal to the legs,
   the position-detecting circuit including a second pair of position-sensing coils respectively disposed at the second ends of the legs for detecting displacement of the conductor from the sensing region in a second direction generally parallel to the legs; and
   display circuitry for displaying the sensed magnitude of the current when the conductor extends through the sensing region, wherein the position-detecting circuit includes first and second comparators respectively connected to the first and second pairs of coils.

14. The ammeter of claim 13, wherein the display circuitry includes a display, and display control circuitry for controlling the operation of the display.

15. The ammeter of claim 14, wherein the display control circuitry includes a logic circuit connected to the outputs of the comparators and a switch connected to the output of the logic circuit and disposed between the current-detecting circuit and the display.

16. A method of measuring current flow in a conductor comprising:

sensing the magnitude of the current flowing in the conductor, defining a sensing region, sensing whether or not the conductor extends through the sensing region, displaying the sensed current magnitude if the conductor extends through the sensing region, and preventing display of the sensed current magnitude if the conductor does not extend through the sensing region, wherein sensing the magnitude of the current and defining a sensing region include disposing a plurality of current-sensing coils in an array, the shape of which defines the sensing region.

17. The method of claim 16, wherein the step of sensing whether or not the conductor extends through the sensing region includes arranging pairs of position-sensing coils for respectively sensing displacement of the conductor from the sensing region in different directions.

18. The method of claim 17, wherein the step of preventing the display of the sensed current magnitude includes comparing polarities of outputs of the coils of a first pair of position-sensing coils.

19. The method of claim 18, wherein the step of preventing display of the sensed current magnitude includes sensing the polarity of outputs of the coils of a second pair of the position-sensing coils.

* * * * *